United States Patent [19]

Serreze

[11] Patent Number: 5,222,090
[45] Date of Patent: Jun. 22, 1993

[54] 700–850 NANOMETER SEMICONDUCTOR DIODE LASER

[75] Inventor: Harvey B. Serreze, Pound Ridge, N.Y.

[73] Assignee: McDonnell Douglas Corporation, St. Louis, Mo.

[21] Appl. No.: 846,136

[22] Filed: Mar. 5, 1992

[51] Int. Cl.$^5$ .............................................. H01S 3/19
[52] U.S. Cl. ........................................ 372/45; 372/44
[58] Field of Search ............................. 372/45, 44, 43

[56] References Cited

U.S. PATENT DOCUMENTS

| | | | |
|---|---|---|---|
| 4,841,531 | 6/1989 | Kondow et al. | 372/45 |
| 4,860,297 | 8/1989 | Hayakawa et al. | 372/45 |
| 5,016,252 | 5/1991 | Hamada et al. | 372/45 |
| 5,153,889 | 10/1992 | Sugawara et al. | 372/45 |

FOREIGN PATENT DOCUMENTS 4042985  2/1992  Japan .................................. 372/45

Primary Examiner—Georgia Y. Epps
Attorney, Agent, or Firm—Guy R. Gosnell; Benjamin Hudson, Jr.; Timothy H. Courson

[57] ABSTRACT

Disclosed herein is a semiconductor laser device comprised of a semiconductor substrate having deposited thereon at least one quantum well active region comprised of an alloy of the group consisting of GaInAsP and AlGaInAs sandwiched between upper and lower confinement layers of AlGaInAsP alloy. The laser device is further comprised of AlGaInP cladding layers.

8 Claims, 1 Drawing Sheet

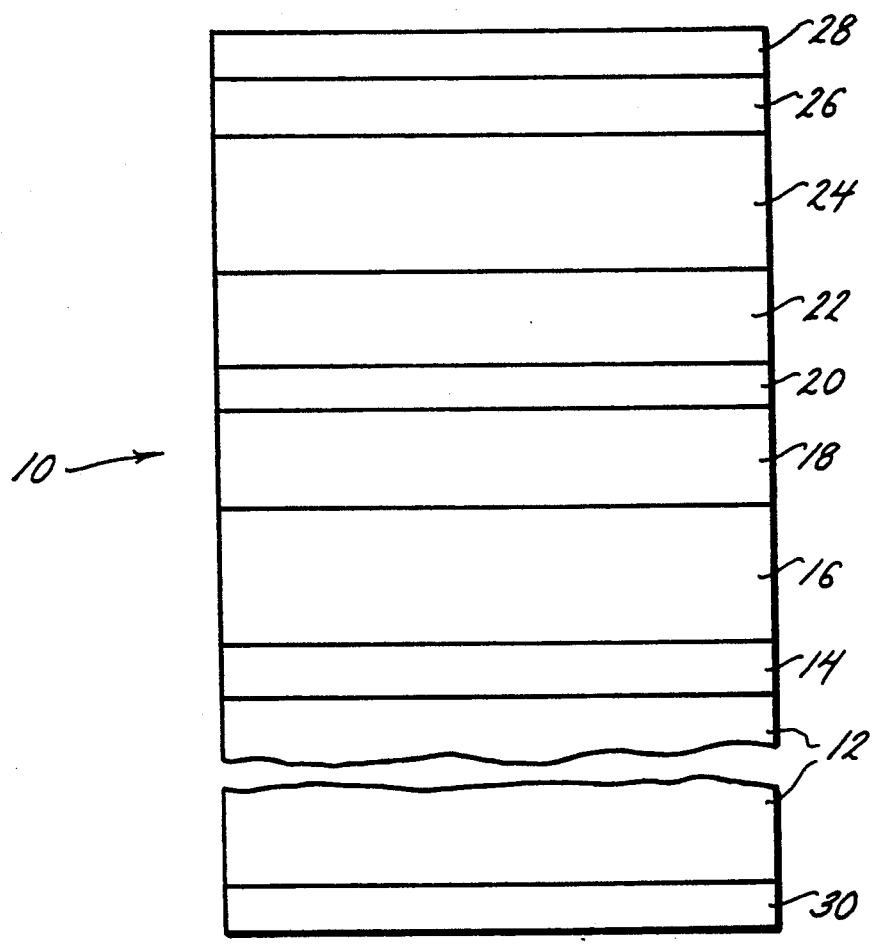

700-850 NANOMETER SEMICONDUCTOR DIODE LASER

BACKGROUND OF THE INVENTION

This invention relates generally to semiconductor laser devices and more particularly to devices which operate at wavelengths of 700-850 nanometers with relatively low threshold current values for outputs having a relatively high power.

Currently semiconductor laser diodes are utilized for a variety of applications. Semiconductor diode lasers comprised of GaAs/AlGaAs materials are commonly utilized due to the relative maturity of the growth and processing technology of these materials. GaAs/AlGaAs semiconductor diode lasers are generally utilized in applications requiring wavelengths from approximately 750 nm to 1 µm. The use of such GaAs/AlGaAs diode lasers having wavelengths less than approximately 750 nm has been accomplished, however, the performance of such diode lasers has proven to be rather poor in terms of threshold current density, characteristic temperature and resultant power output. For example, threshold current densities of greater than 4000 A/cm$^2$ are required for such diode laser systems to operate at 695 nm. This deterioration in performance by GaAs/AlGaAs diode lasers with a decrease in resultant wavelength is generally due to the reduction of barrier heights within the device which in turn decreases the carrier confinement so as to require higher threshold current levels and lower efficiency of the device.

For wavelengths shorter than those for which GaAs/AlGaAs diode lasers can efficiently provide, diode lasers constructed from GaInP/AlGaInP materials grown upon GaAs substrates have typically been utilized. The wavelength of the light output from such diode laser systems, typically varies from less than 630 nm to approximately 700 nm. While there have been recent advances in the performance of GaInP/AlGaInP diode lasers in the shorter wavelength bands, there has been little utilization of GaInP or AlGaInP materials in diode lasers operating at wavelengths much greater than 700 nm.

Previously, semiconductor laser diodes operating within the band of wavelengths between those efficiently produced by the two materials systems previously discussed have been constructed of GaAs/AlGaAs materials due to the relative maturity of the growth and processing technology of these materials even though the performance of such diodes was relatively inefficient in terms of threshold current density, characteristic temperature and power output. Therefore, it would be desirable for a semiconductor laser diode to be constructed to operate with outputs of 700-750 nm while requiring a low threshold current density and having a high characteristic temperature, high internal efficiency, high reliability and a large output power. In addition it would be desirable if such diodes, suitably modified, might also operate suitably in the 750-850 nm band.

SUMMARY

There is provided by this invention a semiconductor laser device which efficiently produces a light output having a wavelength in the range of 700-850 nm. This device utilizes a single or multi-quantum well structure formed of alloys of GaInAsP or AlGaInAs located between confinement layers of alloys of AlGaInAsP. The confinement layers and the quantum well active region are in turn located between a pair of cladding layers comprised of alloys of AlGaInP. The particular alloys selected for the cladding layer and the confinement layers must be such that the lattice constant of the layers match that of the substrate upon which these layers are formed. The composition of the confinement layers may be either a graded index structure or a fixed composition. Likewise, the quantum well structure may be either strained or unstrained. The confinement layers, cladding layers, and quantum well active region are deposited upon the buffer layer which has been deposited in turn upon a substrate, typically comprised of GaAs. The major surface of the semiconductor structure, atop the confinement, cladding, and active regions has a cap layer deposited thereon. Subsequently, metalization layers are deposited on opposite major surfaces of the semiconductor device structure, such that electrical contact can be maintained with the structure. Semiconductor layers are selected such that the quantum well active region and confinement layers form a P-N junction by being located between layers having N-type dopants on one side and P-type dopants on a second side for proper diode response. The semiconductor laser device described herein efficiently produces output light having a wavelength range of 700-850 nm while requiring relatively low threshold current densities for the resultant power levels achieved.

BRIEF DESCRIPTION OF THE DRAWING

The FIGURE illustrates a cross sectional view of a semiconductor laser device incorporating the principle of this invention.

DETAILED DESCRIPTION OF THE PREFERRED EMBODIMENT

Referring now to the FIGURE, there is shown a cross-sectional view of a semiconductor laser device (10) incorporating the principles of this invention. Upon an N-substrate layer 12, typically comprised of gallium arsenide (GaAs), there is deposited an N-buffer layer 14, an N-cladding layer 16, a first confinement layer 18, a quantum well active region 20, a second confinement layer 22, a P-cladding layer 24, a P-cap layer 26, and a P-metalization layer 28. On the opposing major surface of the N-substrate 12 from that on which the N-buffer layer 14 is deposited an N-metal layer 30 is deposited.

The N-buffer layer 14 is comprised of the same material of the N-substrate layer 12, typically GaAs, so as to provide a uniform surface upon which to deposit the remaining layers of the semiconductor structure. The N-cladding layer 16, deposited upon the N-buffer 14, is comprised of an alloy of AlGaInP with the particular alloy selected such that the lattice constant of the N-cladding layer 16 is matched to that of the N-substrate 12 as is well known to those skilled in the art. For maximum electrical confinement, the N-cladding layer 16 should have as large a band gap as possible. For example, $(Al_{0.8}Ga_{0.2})_{0.5}In_{0.5}P$ has a band gap of 2.31 eV as compared with a band gap of 2.09 eV for $Al_{0.8}Ga_{0.2}As$.

Upon the N-cladding layer 16, a first confinement layer 18 is formed from AlGaInAsP alloys. The particular alloy selected depends upon the requirements of the particular application, however, the lattice constant of the alloy forming the first confinement layer 18 should equal the lattice constant of the N-substrate 12 upon which the subsequent semiconductor layers are deposited. Additionally, the first confinement layer 18 may be either a graded index structure in which the fractional amount of aluminum is decreased in a direction from the cladding layer 16 towards the quantum well active region 20 or a fixed composition such that the proportional concentrations of the various materials forming the alloy are constant throughout the confinement layer. An example of a suitable graded confinement layer structure is the use of $(Al_xGa_{1-x})_{0.5}In_{0.5}P$ with X ranging from 0.8 to 0.2 in a direction from the N-cladding layer 16 towards the quantum well active region 20. Examples of suitable fixed composition confinement layers is the use of $(Al_{0.2}Ga_{0.8})_{0.5}In_{0.5}P$ or $Ga_{0.5}In_{0.5}P$ in the case of a GaInAsP quantum well structure or $Al_{0.2}Ga_{0.8}As$ in the case of an AlGaInAs quantum well structure.

Upon the first confinement layer 18 is deposited a quantum well active region 20. The quantum well active region 20 may be either a single quantum well structure, as shown in the FIGURE, or a multi-quantum well structure as is well known to those skilled in the art. A multi-quantum well structure is formed by a plurality of individual quantum well structures separated by barrier layers similar to the first confinement layer 18 previously discussed. The quantum well active region 20 deposited upon the first confinement layer 18 as shown in the FIGURE may be comprised of alloys of either GaInAsP or AlGaInAs. Quantum well structures formed of GaInAsP are preferably, however, since such quantum wells may produce outputs having wavelengths varying from 670 nm, the wavelength produced by pure GaInP, to 860 nm, the wavelength produced by pure GaAs. AlGaInAs quantum wells may also be used, however, the practical range of wavelengths for AlGaInAs quantum wells is typically limited to 750 to 850 nm. The quantum well structures discussed herein may be either unstrained or compressively or tensilely strained wells depending upon the particular requirements and processing capabilities with the use of a slightly strained layer generally producing a more efficient output. For a multi-quantum well structure, each individual quantum well within the quantum well active region should be constructed of identical semiconductor materials such that the plurality of quantum wells will produce the desired wavelength of output light.

A second confinement layer 22 is deposited upon the quantum well active region 20. The second confinement layer 22 should be identical to the previously discussed first confinement layer 18 in that it is comprised of an AlGaInAsP alloy. Additionally, while this second confinement layer 22 may be of either a graded index construction or a fixed composition, the second confinement layer 22 should be of an identical type as that of the first confinement layer 18 such that if the first confinement layer 18 is of a graded index type, the second confinement layer 22 is also of a graded index type with each layer having identical ranges through which the percentages of the elements comprising the layer are varied. The variance in the percentages of the elements in the first and second confinement layers, however, have opposite slopes as the aluminium fraction is the smallest at the interface of the quantum well 20 with each confinement layer and increases within each confinement layer as each confinement layer progresses away from that interface.

A P-cladding layer 24 is deposited on the second confinement layer 22. The P-cladding layer 24 is also identical to the N-cladding layer 16 in all aspects except for the type of dopants, as hereinafter discussed. Thus, the P-cladding layer 24 should be lattice matched to the N-substrate 12 and should be comprised of an alloy of AlGaInP.

On the P-cladding layer 24 is deposited a P-cap layer 26, and a P-metalization layer 28. The P-cap layer 26 is comprised of the same material as that which forms the N-substrate 12, typically GaAs. An optional intermediary layer, not shown in the FIGURE, may be interdisposed between the P-cladding layer 24 and the P-cap layer 26 in order to reduce the barrier between the layers and improve the operating efficiency of the diode. While such an intermediary layer may be comprised of a number of materials, an exemplary material is P-doped GaInP alloy which is compatible with the materials systems discussed heretofore. The P-metalization layer 28 may be of any metal such that ohmic electrical contact may be maintained with the P-side of the semiconductor diode structure 10. For example, a titanium/platinum/gold metal may be utilized to form the P-metal layer 28. The N-metal layer 30 formed on the opposing major surface of the N-substrate 12 opposite that on which the N-buffer layer 14 is formed, may also be of any suitable metal such that ohmic electrical contact may be maintained with the N-side of the semiconductor device 10. A typical N-metal layer 30 may be comprised of a gold/germanium/nickel/gold metal structure.

As is well known to those skilled in the art, the N and P designations for the various semiconductor layers refer to the type of dopants introduced into the material forming the particular semiconductor layer. For the layers having an N-dopant such as the N-substrate 12, N-buffer 14 and N-cladding layers 16, suitable N type dopants include: silicon, selenium and sulfur. Likewise, layers having a P-type dopant introduced therein, such as the P-cladding 24 and P-cap 26 suitable P-type dopants include: zinc, magnesium, or beryllium. The amount of the particular dopant introduced as well as the thickness of the various layers utilized in the semiconductor diode laser structure are well known to those skilled in the art and may be varied as required.

The semiconductor laser device described herein is capable of efficiently operating within a band of wavelengths from 700-850 nm and may be used for many applications including the pumping of solid state lasers who absorption spectra are within this wavelength range. Although there has been illustrated and described specific detail and structure of operations, it is clearly understood that the same were merely for purposes of illustrations and that changes and modifications may be readily made there by those skilled in the art without departing from the spirit and scope of this invention.

What is claimed is:

1. A semiconductor laser device, comprising:
   (a) a substrate;
   (b) at least one quantum well active region comprised of an alloy of the group consisting of GaInAsP and AlGaInAs sandwiched between first and second confinement layers deposited upon a first and second surface of said quantum well active region, respectively, both said confinement layers comprised of an AlGaInAsP alloy;
   (c) an n-type cladding layer deposited upon said first confinement layer, said n-type cladding layer comprised of an AlGaInP alloy;

(d) a p-type cladding layer deposited upon said second confinement layer, said p-type cladding layer comprised of an AlGaInP alloy; and (e) a p-type cap layer and metalization and n-type buffer layer and metalization deposited upon the p-type and n-type cladding layers respectively for applying an electric voltage thereto.

2. A semiconductor laser device, as recited in claim 1, wherein said first and second confinement layers, said n-type cladding layer, and said p-type cladding layer each have a lattice constant substantially equal to the lattice constant of said substrate.

3. A semiconductor laser device, as recited in claim 2, wherein each of said n-type and p-type cladding layers are comprised of a compound selected from the group consisting of $(Al_{0.8}Ga_{0.2})_{0.5}In_{0.5}P$ and $Al_{0.5}In_{0.5}P$.

4. A semiconductor laser device, as recited in claim 2, wherein said quantum well active region is comprised of $Ga_{0.5}In_{0.5}AsP$.

5. A semiconductor laser device, as recited in claim 4, wherein said first and second confinement layers are comprised of a compound selected from the group consisting of $(Al_{0.2}Ga_{0.8})_{0.5}In_{0.5}P$ and GaInP.

6. A semiconductor laser device, as recited in claim 2, wherein said quantum well active region is comprised of AlGaInAs.

7. A semiconductor laser device, as recited in claim 6, wherein said first and second confinement layers are comprised of $(Al_{0.2}Ga_{0.8})_{0.5}In_{0.5}P$.

8. A semiconductor laser device, as recited in claim 2, wherein said first and second confinement layers are comprised of $(Al_xGa_{1-x})_{0.5}In_{0.5}P$ wherein x varies from 0 to 1.0.

* * * * *